United States Patent
Damberg et al.

(10) Patent No.: US 7,709,968 B2
(45) Date of Patent: May 4, 2010

(54) MICRO PIN GRID ARRAY WITH PIN MOTION ISOLATION

(75) Inventors: Philip Damberg, Cupertino, CA (US);
Belgacem Haba, Cupertino, CA (US);
David B. Tuckerman, Orinda, CA (US);
Teck-Gyu Kang, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 491 days.

(21) Appl. No.: 10/985,119

(22) Filed: Nov. 10, 2004

(65) Prior Publication Data
US 2005/0173805 A1 Aug. 11, 2005

Related U.S. Application Data

(60) Provisional application No. 60/533,437, filed on Dec. 30, 2003.

(51) Int. Cl.
H01L 23/48 (2006.01)
H01L 23/52 (2006.01)
H01L 29/40 (2006.01)

(52) U.S. Cl. .............. 257/778; 257/733; 257/786; 257/E21.511; 257/E23.021

(58) Field of Classification Search ........... 257/778, 257/737–738, 779, 780, 782, 786, 773, 730–733, 257/774, E23.02, E21.511, E23.065, E23.021, 257/181, 688
See application file for complete search history.

(56) References Cited

U.S. PATENT DOCUMENTS

| | | | |
|---|---|---|---|
| 4,695,870 A | 9/1987 | Patraw | |
| 4,716,049 A | 12/1987 | Patraw | |
| 4,804,132 A | 2/1989 | Difrancesco | |
| 4,902,600 A | 2/1990 | Tamagawa et al. | |
| 4,924,353 A | 5/1990 | Patraw | |
| 4,975,079 A * | 12/1990 | Beaman et al. | 439/482 |
| 4,982,265 A | 1/1991 | Watanabe et al. | |

(Continued)

FOREIGN PATENT DOCUMENTS

JP 62-68015 A 9/1994

(Continued)

OTHER PUBLICATIONS

North Corporation, "Processed Intra-layer Interconnection Material for PWBs [Etched Copper Bump with Copper Foil]," NMBI™, Version 2001.6.

(Continued)

*Primary Examiner*—Davienne Monbleau
*Assistant Examiner*—Dilinh P Nguyen
(74) *Attorney, Agent, or Firm*—LErner, David, Littenberg, Krumholz & Mentlik, LLP

(57) ABSTRACT

A microelectronic package includes a microelectronic element having faces and contacts, a flexible substrate overlying and spaced from a first face of the microelectronic element, and a plurality of conductive terminals exposed at a surface of the flexible substrate. The conductive terminals are electrically interconnected with the microelectronic element and the flexible substrate includes a gap extending at least partially around at least one of the conductive terminals. In certain embodiments, the package includes a support layer, such as a compliant layer, disposed between the first face of the microelectronic element and the flexible substrate. In other embodiments, the support layer includes at least one opening that is at least partially aligned with one of the conductive terminals.

24 Claims, 20 Drawing Sheets

U.S. PATENT DOCUMENTS

| | | | |
|---|---|---|---|
| 5,068,714 A * | 11/1991 | Seipler | 257/703 |
| 5,083,697 A | 1/1992 | Difrancesco | |
| 5,138,438 A | 8/1992 | Masayuki et al. | |
| 5,148,265 A * | 9/1992 | Khandros et al. | 257/773 |
| 5,148,266 A | 9/1992 | Khandros et al. | |
| 5,189,505 A | 2/1993 | Bartelink | |
| 5,196,726 A | 3/1993 | Nishiguchi et al. | |
| 5,214,308 A | 5/1993 | Nishiguchi et al. | |
| 5,397,997 A | 3/1995 | Tuckerman et al. | |
| 5,409,865 A | 4/1995 | Karnezos | |
| 5,455,390 A | 10/1995 | DiStefano et al. | |
| 5,518,964 A | 5/1996 | DiStefano et al. | |
| 5,615,824 A | 4/1997 | Fjelstad et al. | |
| 5,656,550 A | 8/1997 | Tsuji et al. | |
| 5,659,952 A | 8/1997 | Kovac et al. | |
| 5,679,977 A | 10/1997 | Khandros et al. | |
| 5,731,709 A | 3/1998 | Pastore et al. | |
| 5,798,286 A | 8/1998 | Faraci et al. | |
| 5,802,699 A | 9/1998 | Fjelstad et al. | |
| 5,811,982 A | 9/1998 | Beaman et al. | |
| 5,854,507 A | 12/1998 | Miremadi et al. | |
| 5,973,391 A | 10/1999 | Bischoff et al. | |
| 5,980,270 A | 11/1999 | Fjelstad et al. | |
| 6,001,671 A | 12/1999 | Fjelstad | |
| 6,032,359 A | 3/2000 | Carroll | |
| 6,052,287 A | 4/2000 | Palmer et al. | |
| 6,054,756 A | 4/2000 | DiStefano et al. | |
| 6,175,159 B1 | 1/2001 | Sasaki et al. | |
| 6,177,636 B1 | 1/2001 | Fjelstad | |
| 6,202,297 B1 | 3/2001 | Faraci et al. | |
| 6,217,972 B1 | 4/2001 | Beroz et al. | |
| 6,258,625 B1 | 7/2001 | Brofman et al. | |
| 6,332,270 B2 | 12/2001 | Beaman et al. | |
| 6,358,627 B2 | 3/2002 | Benenati et al. | |
| 6,362,525 B1 | 3/2002 | Rahim | |
| 6,458,411 B1 | 10/2002 | Goossen et al. | |
| 6,495,914 B1 | 12/2002 | Sekine et al. | |
| 6,514,847 B1 | 2/2003 | Ohsawa et al. | |
| 6,515,355 B1 | 2/2003 | Jiang et al. | |
| 6,522,018 B1 | 2/2003 | Tay et al. | |
| 6,545,228 B2 | 4/2003 | Hashimoto et al. | |
| 6,550,666 B2 | 4/2003 | Chew et al. | |
| 6,555,918 B2 | 4/2003 | Masuda et al. | |
| 6,560,117 B2 | 5/2003 | Moon | |
| 6,578,754 B1 | 6/2003 | Tung | |
| 6,624,653 B1 | 9/2003 | Cram | |
| 6,647,310 B1 | 11/2003 | Yi et al. | |
| 6,681,982 B2 | 1/2004 | Tung | |
| 6,782,610 B1 | 8/2004 | Iijima et al. | |
| 6,870,274 B2 | 3/2005 | Huang et al. | |
| 6,902,869 B2 | 6/2005 | Appelt et al. | |
| 2002/0125571 A1 | 9/2002 | Corisis et al. | |
| 2002/0153602 A1 | 10/2002 | Tay et al. | |
| 2003/0107118 A1 | 6/2003 | Pflughaupt et al. | |
| 2003/0132518 A1 | 7/2003 | Castro | |
| 2003/0164540 A1 | 9/2003 | Lee et al. | |
| 2004/0031972 A1 | 2/2004 | Pflughaupt et al. | |
| 2005/0116326 A1 | 6/2005 | Haba et al. | |
| 2005/0285246 A1 | 12/2005 | Haba et al. | |

OTHER PUBLICATIONS

Neo-Manhattan Technology, A Novel HDI Manufacturing Process, "High-Density Interconnects for Advanced Flex Substrates & 3-D Package Stacking,"IPC Flex & Chips Symposium, Tempe, AZ, Feb. 11-12, 2003.

* cited by examiner

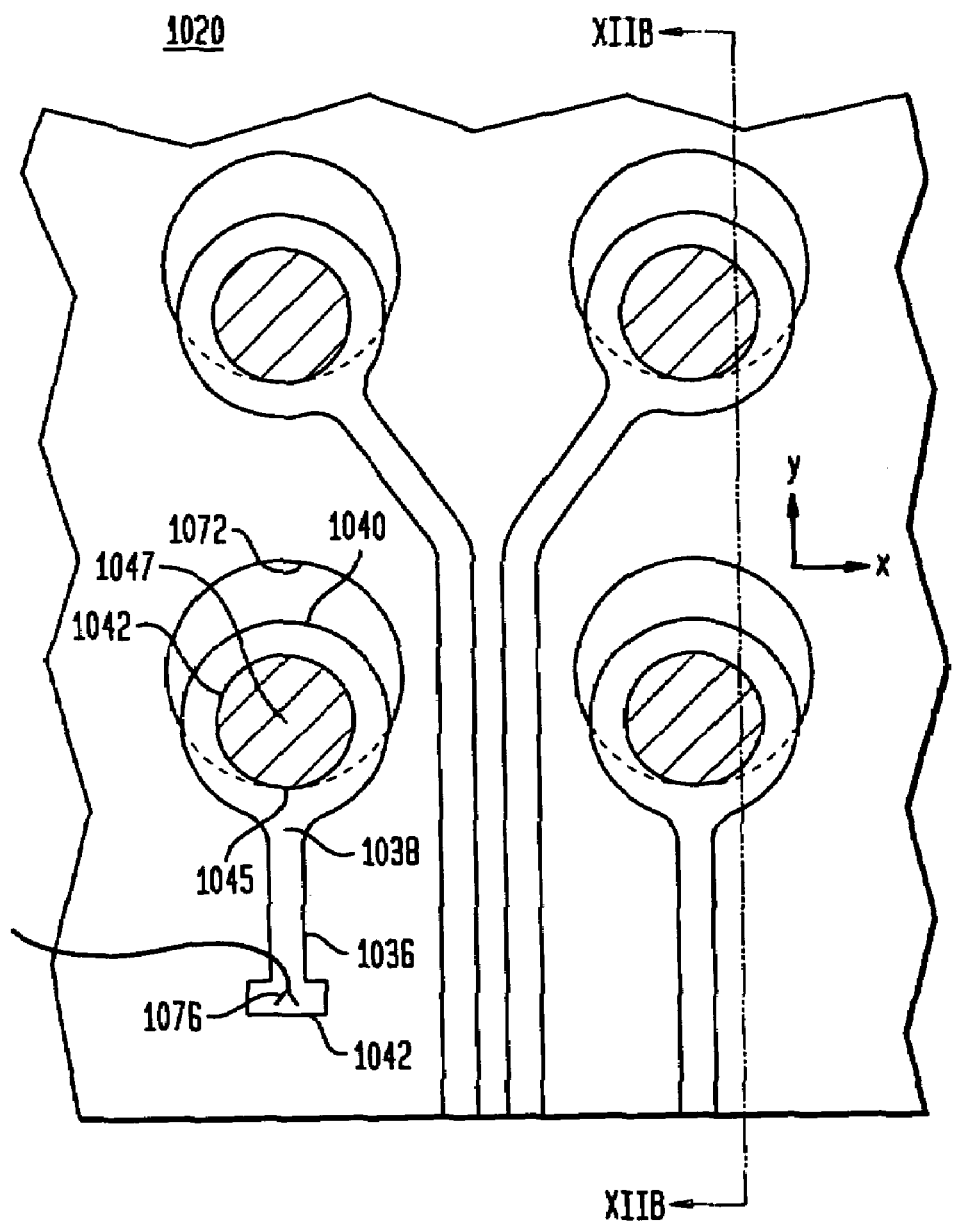

MICRO PIN GRID ARRAY WITH PIN MOTION ISOLATION

CROSS REFERENCE TO RELATED APPLICATIONS

The present application claims the benefit of the filing date of U.S. Provisional Application No. 60/533,437 filed Dec. 30, 2003, the disclosure of which is hereby incorporated herein by reference.

FIELD OF THE INVENTION

The present invention generally relates to microelectronic packages and more specifically to methods of making and testing microelectronic packages.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages which facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices intended for high-frequency operation typically must be tested by applying high frequency signals. This requirement imposes constraints on the electrical characteristics of the signal paths in the test fixture, which further complicates construction of the test fixture.

Additionally, when testing packaged devices having solder balls connected with terminals, solder tends to accumulate on those parts of the test fixture which engage the solder balls. This accumulation of solder residue can shorten the life of the test fixture and impair its reliability.

A variety of solutions have been put forth to deal with the aforementioned problems. Certain packages disclosed in the aforementioned patents have terminals which can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device are advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer is provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals which can be engaged in a socket or solder-bonded to features of a substrate as, for example, a circuit panel. Because the posts are movable with respect to the microelectronic device, such a package substantially accommodates thermal coefficient of expansion mismatches between the device and a supporting substrate when the device is in use. Moreover, the tips of the posts can be coplanar or nearly coplanar.

Despite all of the above-described advances in the art, still further improvements in making and testing microelectronic packages would be desirable.

SUMMARY OF THE INVENTION

In certain preferred embodiments of the present invention a microelectronic package includes a microelectronic element, such as a semiconductor chip, having faces and contacts, and a flexible substrate overlying and spaced from a first face of the microelectronic element. The flexible substrate may include a dielectric sheet or a polymeric film. The package also preferably includes a plurality of conductive terminals exposed at a surface of the flexible substrate, the conductive terminals being electrically interconnected with the microelectronic element. In this aspect of the invention, the flexible substrate most desirably includes a gap extending at least partially around at least one of the conductive terminals and defining a region holding one or more terminals which region can be displaced at least partially independently of the remainder of the substrate. In preferred embodiments according to this aspect of the present invention, the gap facilitates flexing of the substrate, and thus facilitates movement of the terminals. This action is useful during engagement of the terminals with a test fixture.

The flexible substrate may include a plurality of gaps defining a plurality of regions of the substrate. In such an arrangement, each of the conductive terminals may be connected with one of the plurality of regions so that the conductive terminals are free to move independently of one another. For example, the gap in the flexible substrate may extend more than halfway around the at least one of the conductive terminals to define a flap portion of the flexible substrate that is hingedly connected with a remaining portion of the flexible substrate. The conductive terminals may be mounted on the flap portion of the flexible substrate.

The conductive terminals desirably face away from the first face of the microelectronic element. The conductive terminals may include conductive posts that extend from the flexible substrate and project away from the first face of the microelectronic element. The tips of the posts can move in horizontal directions upon flexure of the substrate. As further discussed below, this can cause the tips of the posts to wipe across the surfaces of terminals on a test circuit board.

The microelectronic package may also include a support layer disposed between the first face of the microelectronic element and the flexible substrate. The support layer may include one or more openings, the openings being partially aligned with the conductive terminals so as to provide asymmetrical support to the terminals. As further explained below, such asymmetrical support can promote tilting of the terminals and wiping action. In other embodiments, the at least one opening in the support layer is substantially aligned with one of said conductive terminals. The support layer optionally may be formed from a compliant material.

In other preferred embodiments, the gap defines first and second regions of the flexible substrate, whereby the first region is movable relative to the second region, and the at least one of the conductive terminals lies in the first region of the flexible substrate. The gap may extend at least partially around two or more of the conductive terminals. The gap may also lie between two or more of the conductive terminals. The gap may have an asymmetrical shape, a symmetrical shape, or may be in the form of a circular segment. The gap may also be continuous or intermittent. In still other preferred embodiments, the flexible substrate may have a plurality of gaps that give the substrate a web-like appearance. In this case, the electrically conductive components of the package are provided on the substrate, between the gaps.

The contacts of the microelectronic element are desirably accessible at the first face of the microelectronic element. That is, the flexible substrate overlies the front or contact-bearing face of the microelectronic element. However, the microelectronic element may have a second face opposite the first face and the contacts may be accessible at the second face of the microelectronic element.

The microelectronic package may also include conductive elements, such as conductive traces provided on said flexible substrate, for electrically interconnecting said conductive terminals and said microelectronic element.

In a further aspect of the present invention, a microelectronic package includes a microelectronic element having faces and contacts, a support layer, such as a compliant support layer, overlying a first face of the microelectronic element, and a flexible substrate overlying the support layer and spaced from the first face of the microelectronic element. The package also desirably includes a plurality of conductive terminals exposed at a surface of the flexible substrate, the conductive terminals being electrically interconnected with the microelectronic element. The support layer has at least one opening at least partially aligned with at least one of the conductive terminals. The openings in the support layer enhance flexibility of the substrate in the vicinity of the terminals.

In certain embodiments, the terminals are substantially aligned with the openings of the support layer.

In other embodiments, the conductive terminals are only partially aligned with the plurality of openings. Stated another way, the terminals are offset with respect to the openings to provide asymmetrical support. As further explained below, this causes the terminals to tilt as the substrate flexes over the openings. Here again, the conductive terminals may include conductive posts extending from the flexible substrate and projecting away from the first face of the microelectronic element.

In still another preferred embodiment of the present invention, a microelectronic package includes a microelectronic element having faces and contacts, a support layer, such as a compliant support layer, overlying a first face of the microelectronic element, the support layer having a plurality of openings, and a plurality of conductive terminals overlying the microelectronic element and being electrically interconnected with the microelectronic element. Each conductive terminal desirably has a base having a first section overlying the support layer and a second section overlying one of the openings of the support layer. Here again, the terminals may be in the form of posts. In this arrangement, the terminals may be physically held over the openings by structures other than a flexible dielectric substrate. For example, the traces which connect the terminals to the microelectronic element may also serve as flexible mountings for the terminals. In this arrangement as well, the support layer can be configured to provide asymmetrical support and to cause the terminals to tilt upon engagement with contact elements as, for example, the contact elements of a test fixture.

Still further aspects of the present invention provide methods of processing microelectronic element. In certain methods according to this aspect of the invention, a microelectronic package having a microelectronic element, a mounting structure and a plurality of terminals carried on the mounting structure and electrically connected to the microelectronic element, is advanced toward a mating unit such as a test board until the terminals engage contact elements of the mating unit and vertically-directed contact forces applied by the contact elements to the terminals cause the mounting structure to deform so that at least some of the terminals move. The deformation of the mounting structure may cause the terminals to tilt about horizontal axes. Where the terminals are vertically-extensive structures such as posts, this causes the tips of the posts to wipe across the contact elements of the mating unit. Where the mounting structure includes a flexible substrate having gaps therein, a support layer having openings therein, or both, these features facilitate deformation of the mounting structure.

These and other preferred embodiments of the present invention will be described in more detail below.

BRIEF DESCRIPTION OF THE DRAWINGS

FIG. 12A shows a fragmentary plan view of a microelectronic package, in accordance with yet other preferred embodiments of the present invention.

DETAILED DESCRIPTION

Figure 1A:
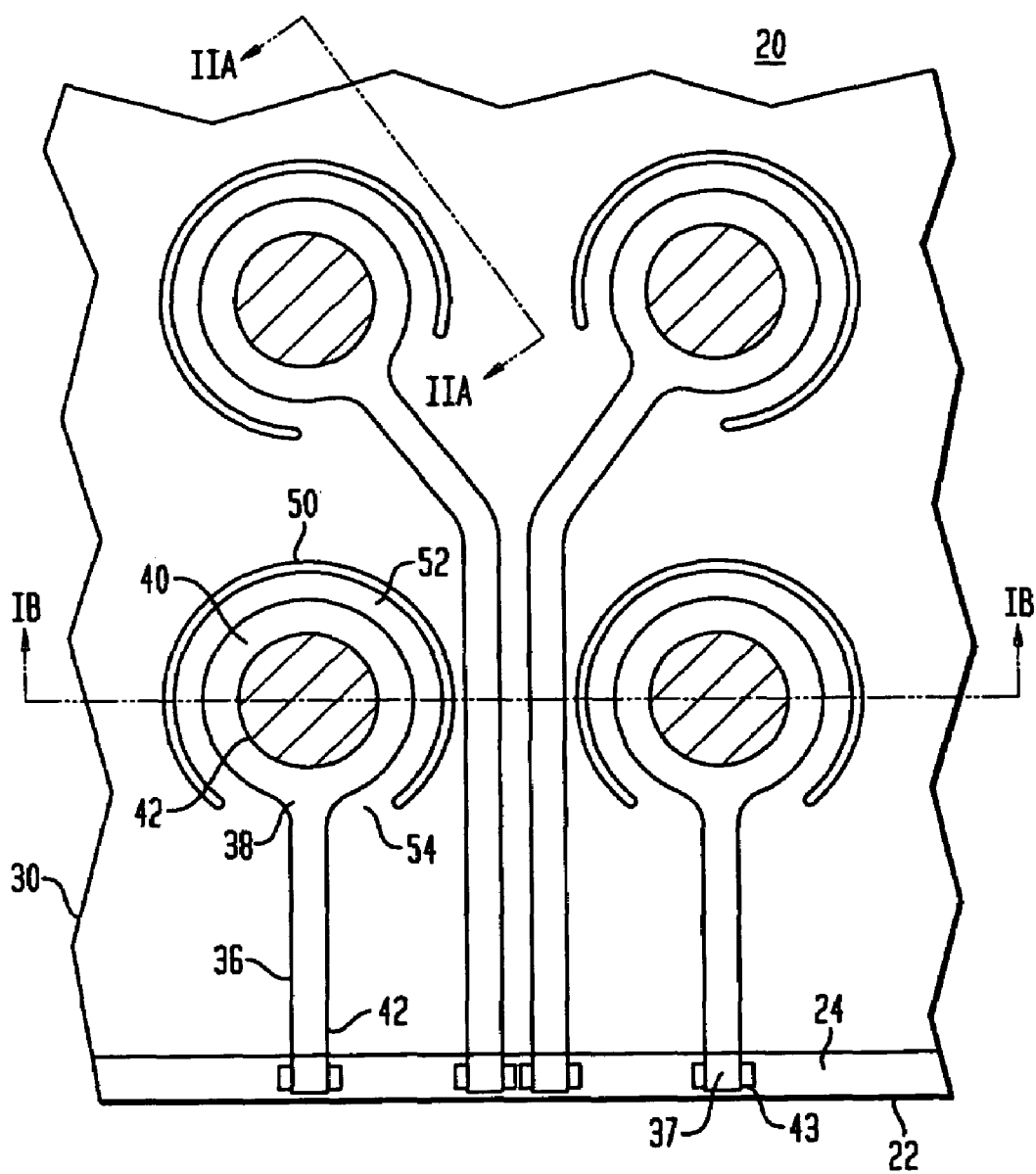
FIG. 1A is a fragmentary plan view of a microelectronic package, in accordance with one preferred embodiment of the present invention.
Figure 1B:
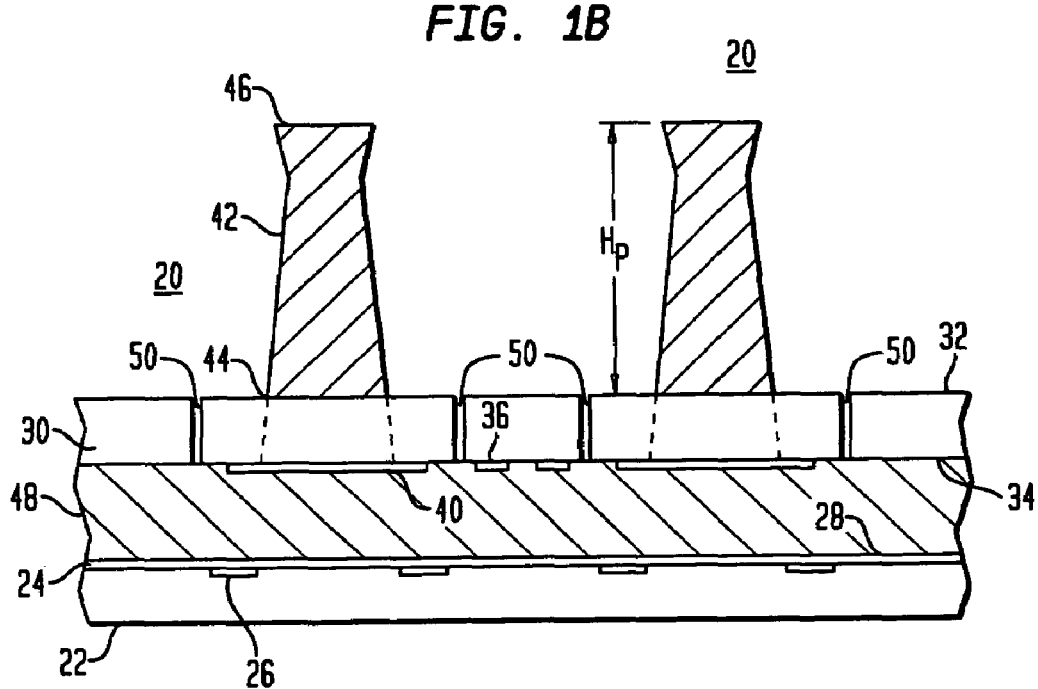
FIG. 1B is a cross-sectional view of the package shown in FIG. 1A.

Referring to FIGS. 1A and 1B, a microelectronic package 20 in accordance with one embodiment of the present invention includes a microelectronic element 22 such as a semiconductor chip having a front or contact-bearing face 24 and electrical contacts 26 exposed at the face 24. A passivation layer 28 may be formed over the contact-bearing face 24 with openings at contacts 26.

The microelectronic package 20 preferably includes a flexible dielectric substrate 30, such as a polyimide or other polymeric sheet, including a top surface 32 and a bottom surface 34 remote therefrom. Although the thickness of the dielectric substrate 30 may vary depending upon the application, the dielectric substrate most typically is about 15-100 µm thick. The flexible sheet 30 has conductive traces 36 thereon. In the particular embodiment illustrated in FIGS. 1A and 1B, the conductive traces are disposed on the bottom surface 34 of the flexible sheet 30. However, in other embodiments, the conductive traces 36 may extend on the top surface 32 of the flexible sheet 30; on both the top and bottom surfaces or within the interior of flexible sheet 30. Thus, as used in this disclosure, a statement that a first feature is disposed "on" a second feature should not be understood as requiring that the first feature lie on a surface of the second feature. Conductive traces 36 may be formed from any electrically conductive material, but most typically are formed from copper, copper alloys, gold or combinations of these materials. The thickness of the traces 36 may also vary depending upon the application, but typically is about 10-25 µm. The traces 36 are arranged so that each trace has a post end 38 terminating at a capture pad 40 and a connection end 42 remote from the post end 38.

Electrically conductive terminals in the form of posts or pillars 42 project from the top surface 32 of flexible substrate 30. Each post 42 is connected to the conductive capture pad 40 at the post end 30 of one of the traces 36. In the particular embodiment of FIGS. 1A and 1B, the posts 42 extend upwardly through the dielectric sheet 30 from the capture pads 40 of the traces 36. The exact dimensions of the posts may vary over a significant range but most typically the height $H_p$ of each post 42 above the top surface 32 of the flexible sheet 30 is about 50-300 µm. Each post 42 has a base 44 adjacent the flexible sheet 30 and a tip 46 remote from the flexible sheet. In the particular embodiment illustrated, the posts extend in directions that are substantially parallel to one another. The bases of the posts typically are about 100-600 µm in diameter, and the tips typically are about 40-200 µm in diameter. The posts 42 may be formed from any electrically conductive material, but desirably are formed from metallic material such as copper, copper alloys, gold and combinations thereof. For example, the posts may be formed principally from copper with a layer of gold at the surfaces of the posts.

The dielectric sheet 30, traces 36 and posts 42 may be fabricated by a process such as that disclosed in co-pending, commonly assigned U.S. provisional patent application Ser. No. 60/508,970, the disclosure of which is incorporated by reference herein. As disclosed in greater detail in the '970 application, a metallic plate is etched or otherwise treated to form numerous metallic posts projecting from the plate. A dielectric layer is applied to this plate so that the posts project through the dielectric layer. An inner face or side of the dielectric layer faces toward the metallic plate, whereas the outer side of the dielectric layer faces towards the tips of the posts. The dielectric layer may be fabricated by coating a dielectric such as a polyimide onto the plate around the posts or, more typically, by forcibly engaging the posts with the dielectric sheet so that the posts penetrate through the sheet. Once the sheet is in place, the metallic plate is etched to form individual traces on the inner side of the dielectric layer. Alternatively, conventional processes such as plating may form the traces. An etching process may also be used whereby the posts may be formed using the methods disclosed in commonly assigned U.S. Pat. No. 6,177,636, the disclosure of which is hereby incorporated by reference herein. In yet another preferred embodiment, the posts may be fabricated as individual elements and assembled to the flexible sheet in any suitable manner which connects the posts 42 to the traces 36.

The microelectronic package 20 also preferably includes a support layer such as a compliant layer 48 disposed between flexible dielectric sheet 30 and front face 24 of semiconductor chip 22. Merely by way of example, the compliant layer 48 may be a gel, foam or the like, or a stiffer material such as an epoxy or other adhesive.

The flexible dielectric substrate 30 includes at least one gap 50 formed therein. The gap 50 may be formed in the flexible substrate 30 by any known method used to perforate a material such as by laser cutting, chemical etching, high pressure liquid stream cutting or mechanical punching. In the particular preferred embodiment shown in FIGS. 1A and 1B, a gap 50 is formed at least partially around each conductive post 42. The plurality of gaps 50 define a plurality of regions 52 of flexible substrate 30. One of the conductive posts 42 is mounted on each region 52 defined by one of the gaps 50. Each region 52 is connected to the remainder of the substrate 30 by a flap section 54.

The conductive traces 36 are electrically connected to contacts 43 on the microelectronic element 22 and provide electrically conductive paths between the microelectronic element 22 and the conductive posts 42. In the particular arrangement shown, contacts 43 are disposed in a row along an edge of surface 24 of the microelectronic element 22. In the particular arrangement shown, the traces are connected to the contacts by leads 37 formed integrally with traces 36. Any other suitable connection can be used as, for example, wire bonds extending between the traces and contacts. Also, the contacts 43 need not be disposed adjacent an edge of the microelectronic element. Certain common semiconductor chips have contacts disposed in arrays distributed over the front surface of the chip, whereas others have contacts disposed in one or more rows near the center of the chip surface. The substrate 30 and compliant layer 48 may be provided with appropriate apertures, commonly referred to as bond windows, aligned with such contacts.

Figure 2A:
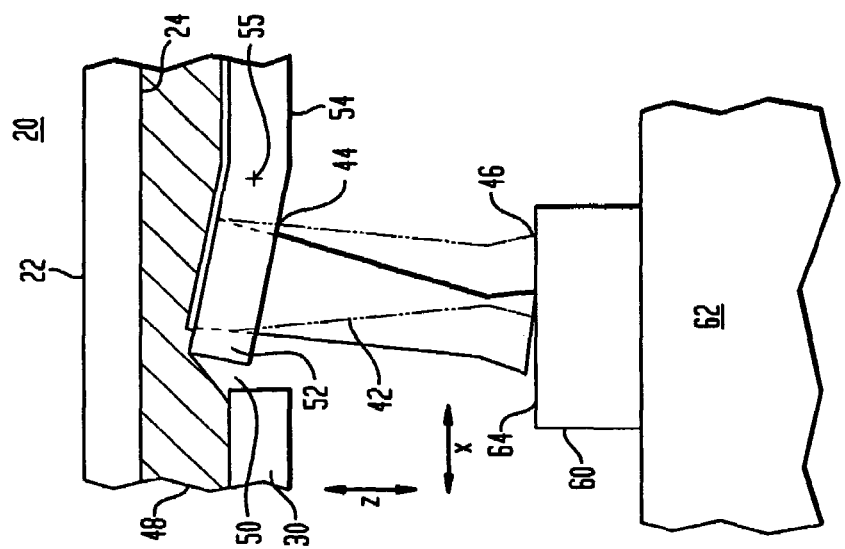
FIGS. 2A and 2B show a fragmentary sectional view of the package of FIG. 1A during a testing operation, in accordance with certain preferred embodiments of the present invention.
Figure 2B:
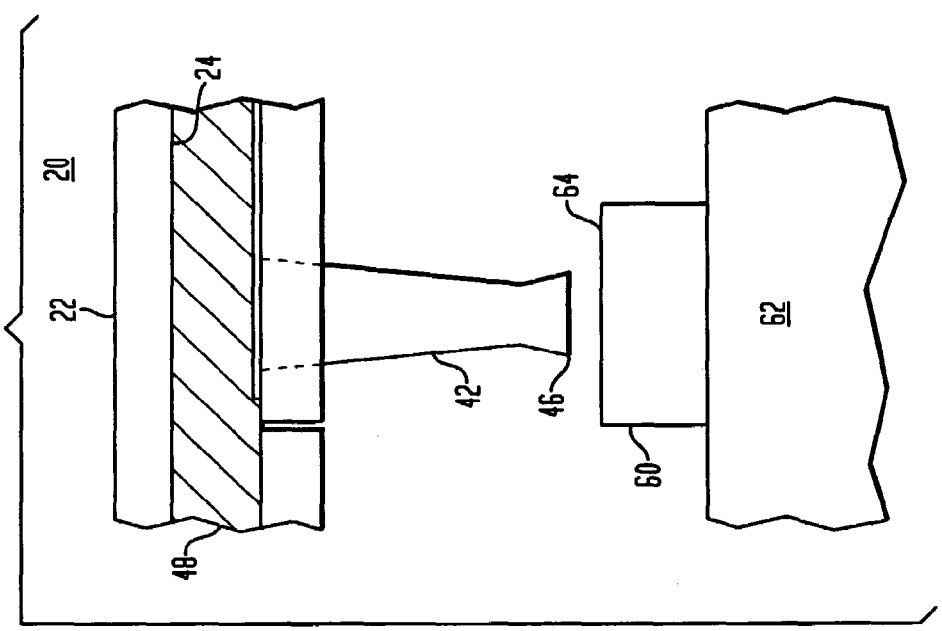

In a method of operation according to a further embodiment of the present invention, a microelectronic package 20, such as the package described above with reference to FIGS. 1A and 1B, is tested by juxtaposing the conductive posts 42 with contact pads 60 on a second microelectronic element 62 such as a circuitized test board (FIGS. 2A and 2B). The conductive posts 42 are placed in substantial alignment with top surfaces 64 of the respective contact pads 60. The top surfaces may be disposed at different heights so that the top surfaces do not lie in the same plane. Such non-planarity can arise from causes such as warpage of the circuit board 62 itself and unequal thickness of the contact pads 60. In addition, the tips 46 of the conductive posts 42 may not be precisely co-planar with one another due to such factors as unequal heights of the conductive posts 42; non-planarity of the front surface 24 of semiconductor chip 22 and non-uniformity of compliant layer 48. In addition, the microelectronic package 20 may be tilted slightly with respect to the circuit board 62. For all of these and other reasons, the vertical distances between the tips 46 of the conductive posts 42 and the top surfaces 64 of the contact pads 60 may be unequal.

Referring to FIG. 2B, the microelectronic package 20 is moved toward the test board 62 by moving the test board, the package or both. Initially, the microelectronic package is moved downward in a direction indicated by axis Z so that the tips 46 of conductive posts 42 engage the top surface 64 of contacts 60. The gap 50 extending through flexible substrate 30 enables the region 52 of substrate 30 to have hinge-like movement at flap 54. As a result, the base of each conductive post 42 is able to move in a generally vertical direction, indicated as direction Z in FIG. 2B, substantially independently of the remainder of the substrate 30 and substantially independently of the other conductive posts. Because movement of the posts does not require displacement of the entire substrate 30, only those regions of compliant layer 48 aligned with regions 52 are compressed as the base 44 of each post moves toward microelectronic element 22. Stated another way, the forces applied in the Z direction by the contacts 60 urging the posts toward the microelectronic element 22 are substantially concentrated in those regions of the compliant layer 48 aligned with regions 52. The effectively increases the compliance of layer 48, so that the posts 42 can be moved to the same extent with lower forces than would be the case in an otherwise comparable system with a continuous substrate 30, without the aforementioned gaps.

Substantially independent movability of the individual posts 42 in the Z direction helps to assure that all of the posts 42 can be brought into engagement with all of the corresponding contacts 60 simultaneously. This helps to insure reliable electrical interconnections between the tips 46 of conductive posts and contacts 60. Moreover, because each region 52 of the substrate tends to bend around the hinge-like flap 54, each region, and the post 42 connected thereto, tends to tilt around a theoretical horizontal axis 55 in or near the flap 54. Such tilting movement tends to cause the tip 46 of the post mounted to such flap to move in a horizontal direction indicated by arrow X relative to the remainder of the package, and hence relative to the associated contact 60, as the tips of the posts engage the contact. The posts move from the starting orientation shown in broken lines in FIG. 2B to the orientation shown in solid lines. The horizontal movement of the tips 46 causes the tips to wipe across the top surfaces 64 of the contacts, which further aids in establishing reliable electrical connections.

Additionally, the microelectronic package 20 may also be moved in horizontal direction X relative to test board 62 so as to provide additional wiping motion between tip 46 and top surface 64 of contact 60.

Figure 3:
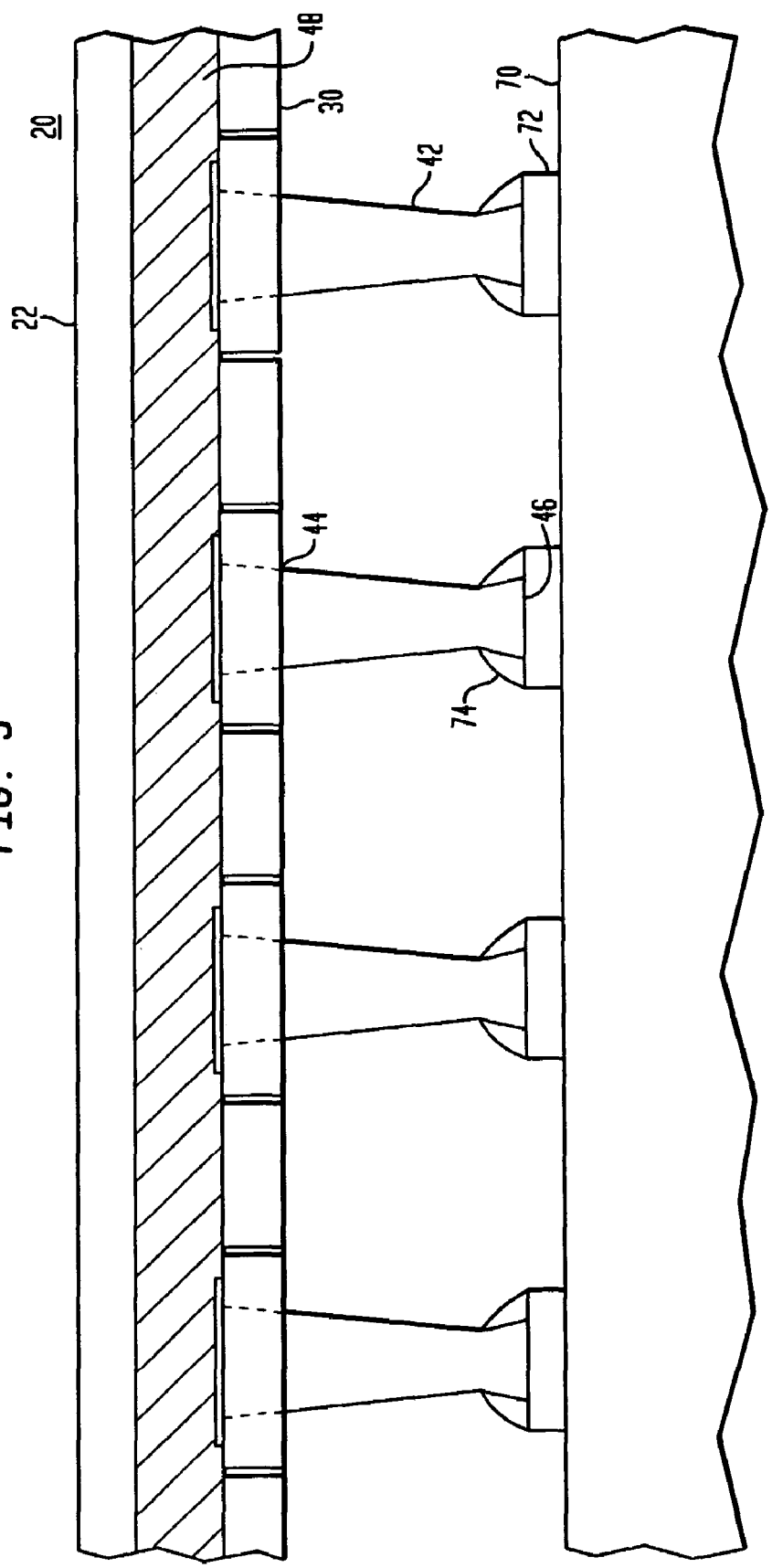
FIG. 3 is a diagrammatic elevational view of an assembly including the package of FIGS. 1A-2B.

While the posts remain in contact with engagement with test board 62, the microelectronic package 20 is tested by applying signals and potentials such as power potentials and ground through the engaged posts 42 and contact pads 60. After testing, the package is separated from the test board 62. The package then may be connected to a circuit panel such as a conventional circuit board 70 (FIG. 3) by bonding the posts 42 to the contact pads 72 of the circuit board as, for example, by solder-bonding the tips 46 of the posts to the contact pads. The solder may be applied to the posts or to the contact pads of the circuit board prior to assembly of the package with the circuit board, and reflowed using techniques and equipment commonly used in surface mounting. Most preferably, the solder forms fillets 74 encompassing the tips 46 of the posts.

The posts reinforce the solder so as to form strong, reliable connections resistant to mechanical fatigue. During manufacture and during service, differential thermal expansion and contraction of the microelectronic element 22 and the circuit board 70 may tend to move contact pads 72 relative to the microelectronic element. Preferably, in the completed assembly the tips 46 can move to appreciably accommodate such relative motion and this limit stress on the solder bonds. Some of this relative motion may be provided by flexing of posts 42. Also, the compliant layer 48 and flexible substrate 30 continue to allow the bases 44 of the posts to move relative to the microelectronic element. Here again, the motion of the post bases may include both linear displacements and tilting as, for example, by bending of the flaps. The movement of the post bases 44 may include movement of individual regions of the substrate, at least partially independently of movement of other regions of the substrate. In the completed assembly as well, the gaps which effectively subdivide the substrate into independently movable regions increase the movability of the post bases and increase the effective compliance of layer 48.

Figure 4:
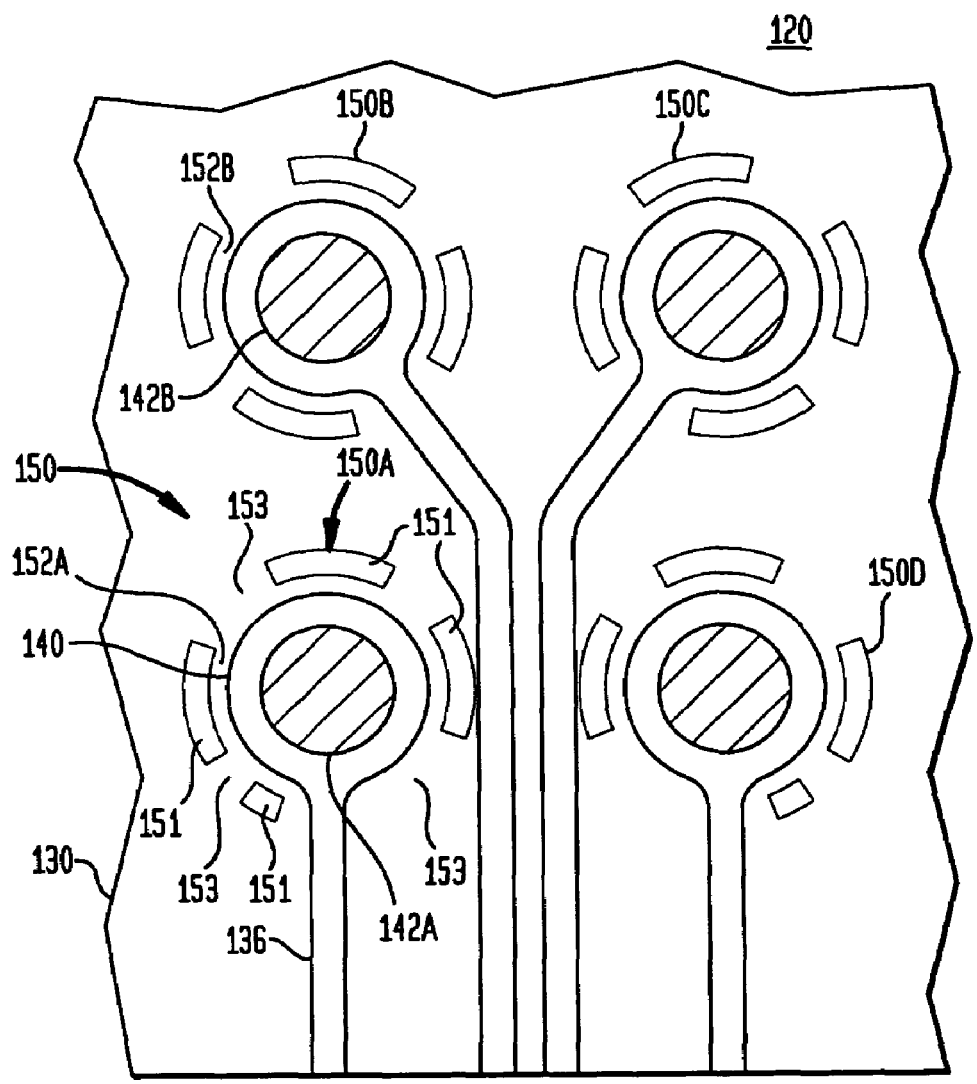
FIG. 4 shows a fragmentary plan view of a microelectronic package, in accordance with other preferred embodiments of the present invention.

Referring to FIG. 4, a microelectronic package 120 in accordance with another preferred embodiment may have features similar to those discussed above with reference to FIGS. 1A-3. Thus, in the embodiment of FIG. 4, microelectronic package 120 includes a flexible dielectric substrate 130 having electrically conductive traces 136, capture pads 140 connected with traces 136 and conductive posts 142 connected with capture pads 140. The flexible dielectric substrate 130 has a plurality of gaps 150 extending therethrough. A first gap 150A is provided around first conductive post 142A. The gap 150A is intermittent, and incorporates multiple gap portions 151 interspersed with webs 153 of substrate material. Gap 150A extends in a circular path at least partially about first conductive post 142A. The first gap 150A defines a first region 152A that is distinct from remaining regions of the flexible dielectric substrate 130. Substrate 130 includes second gap 150B surrounding second conductive post 142B for defining a second region 152B of the substrate. Similarly, the substrate 130 includes third gap 150C and fourth gap 150D. In this embodiment as well, the substrate has plural gaps defining a plurality of distinct regions of the flexible substrate. Here again, one of the conductive posts is located in each such region. As a result, each conductive post is able to move independently of the other conductive posts. In this embodiment, the movement of the individual regions relative to the remainder of the substrate may include, for example, flexing of the webs 153 as rather than the flap bending action discussed above. However, in this embodiment as well, subdivision of the substrate into individual regions enhances movability of the posts. For example, loads applied to the individual posts will be transmitted principally to localized regions of a compliant layer (not shown) disposed between the substrate and the microelectronic element, thereby increasing the effective compliance of the compliant layer.

Figure 5:
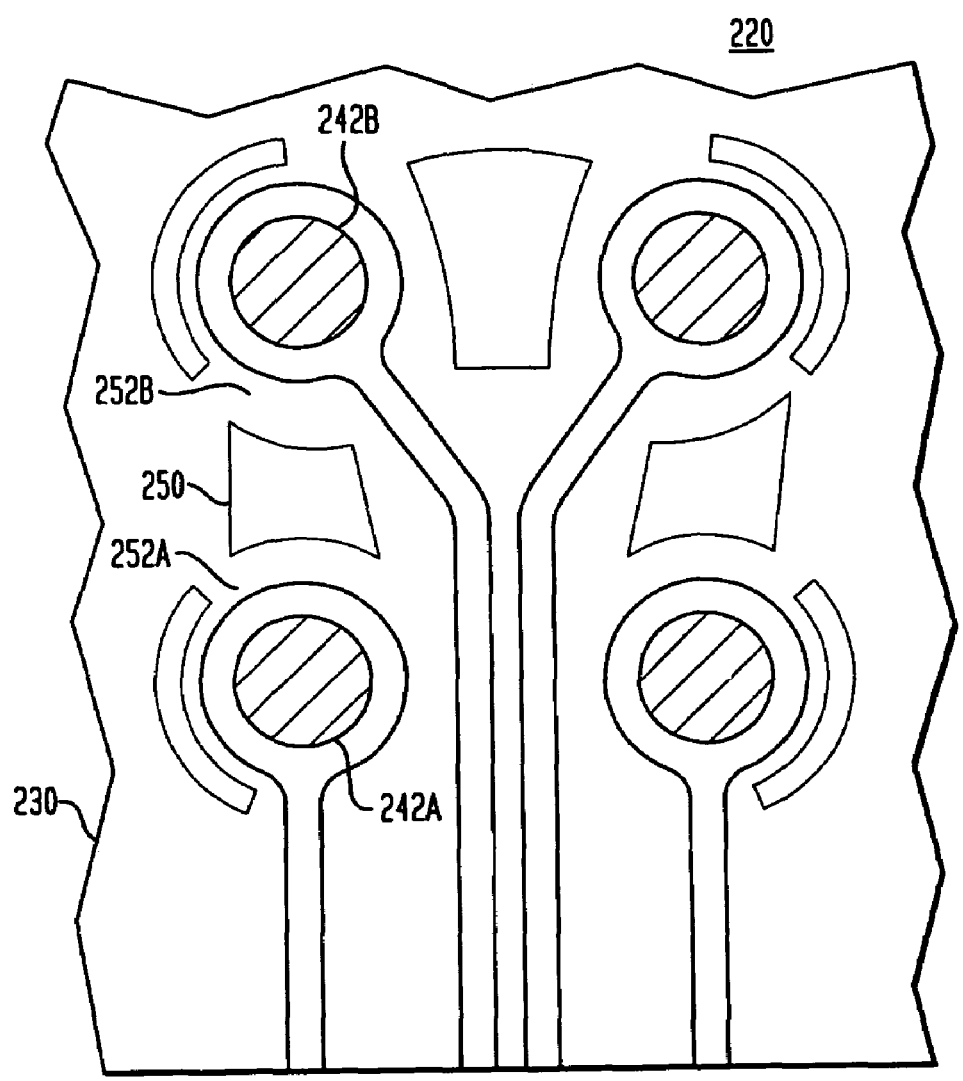
FIG. 5 shows a fragmentary plan view of a microelectronic package, in accordance with another preferred embodiment of the present invention.

FIG. 5 shows a microelectronic package 220 in accordance with another embodiment of the present invention. In this embodiment, adjacent regions 252A and 252B are separated from one another by a common gap 250A bordering both of these regions. The gap 250 may be symmetrical or asymmetrical. The common gap 250 thus at least partially defines a first region 252A connected with a first conductive post 242A and a second region 252B for receiving second conductive post 242B. Regions 252A and 252B are further separated from the remainder of the substrate by additional gaps 250A and 250B. In this embodiment as well, the individual regions, and hence the individual conductive posts are able to move independently of one another. The remaining features of this embodiment may be similar to those discussed above.

Figure 6:
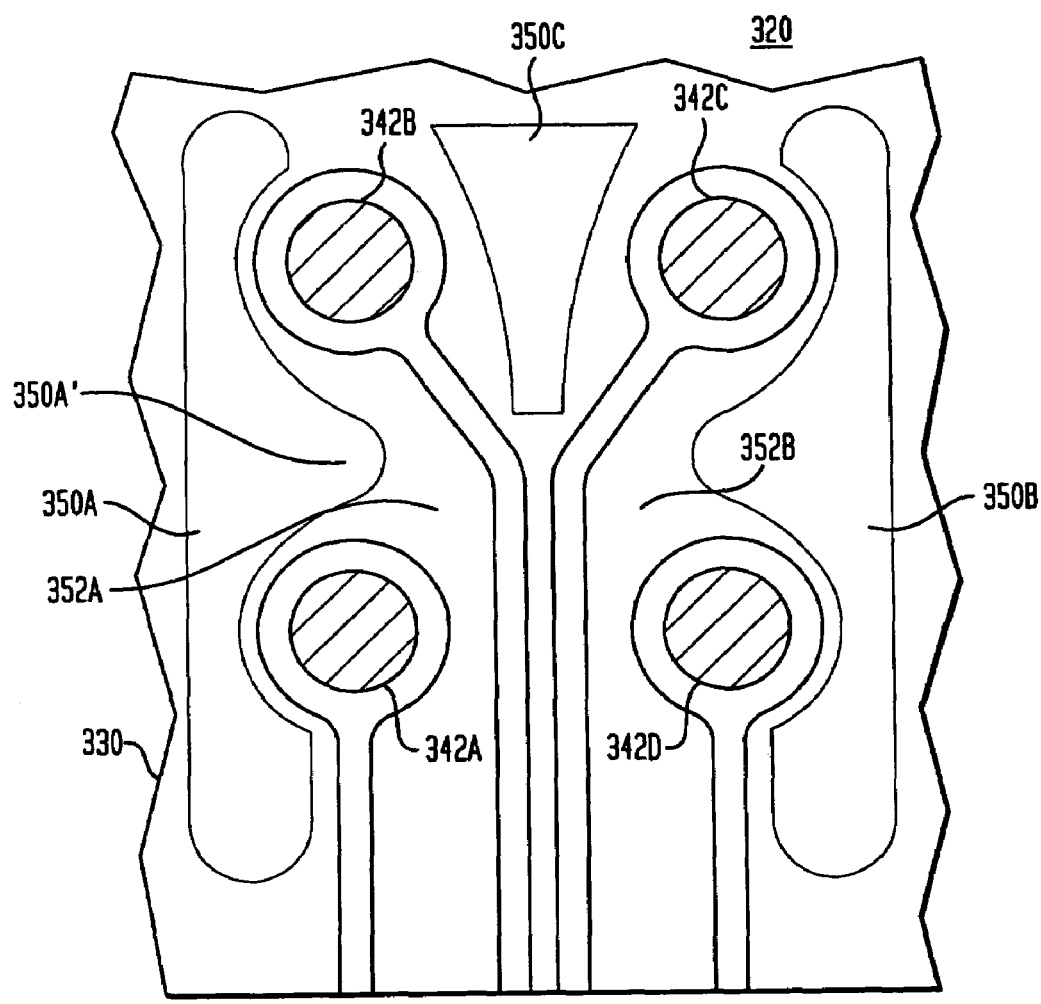
FIG. 6 shows a fragmentary plan view of a microelectronic package, in accordance with yet another preferred embodiment of the present invention.

In a microelectronic package 320 according to yet another embodiment of the present invention (FIG. 6), the flexible substrate 330 has a single gap 350 that at least partially surrounds two conductive posts 342A and 342B, and at least partially separates a region 352A carrying both of posts 342A and 342B from the remainder of the substrate. Depending on the properties of the substrate material, region 352A may flex as a unit, so that the movement of posts 342A and 342B are linked to a greater degree than would be the case if each of these posts was disposed on an individual region of the substrate. To mitigate this effect, gap 350A includes a section 350A' projecting into region 352A and thus partially subdividing this region into individual regions associated with individual posts. In further variants, the projecting sections may be omitted. In still other variants, more than two posts may be provided on a single region. A second gap 350B at least partially surrounds third and fourth conductive posts 342C and 342D, and at least partially defines a further region 352B of the substrate. Yet another gap 350C intervenes between regions 352A and 352B. In this embodiment, the gaps occupy a substantial portion of the area of the substrate, so that the flexible dielectric substrate has a web-like appearance. Stated another way, the flexible dielectric substrate is substantially made up of the regions occupied by the posts and the regions occupied by the traces, with most or all of the other regions omitted. Such an arrangement can be used in embodiments where each post is provided on a separate region. whereby the electrically conductive elements are provided on the substrate and between the gaps.

Figure 7:
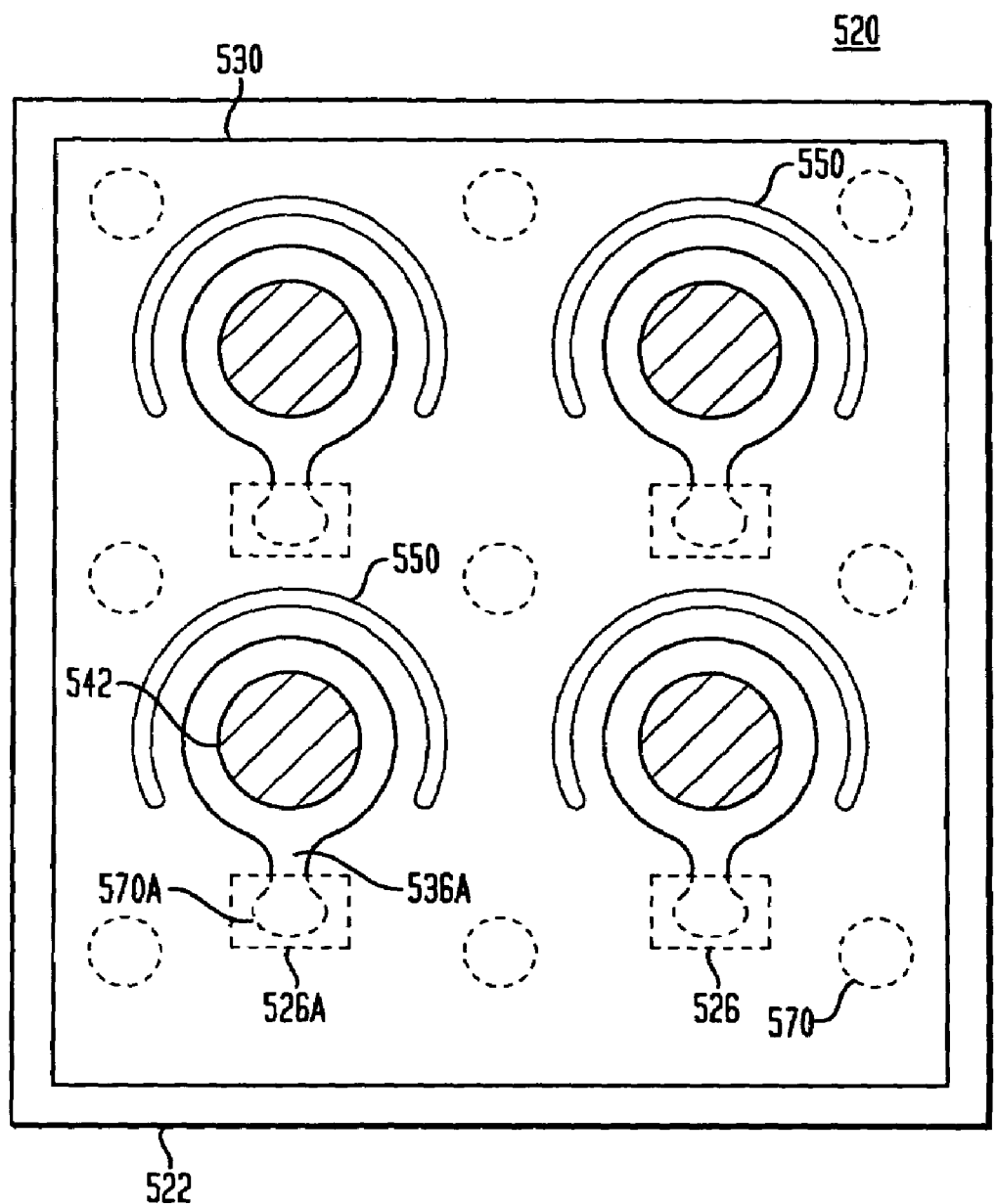
FIG. 7 shows a fragmentary plan view of a microelectronic package, in accordance with still further preferred embodiments of the present invention.

FIG. 7 shows a microelectronic package 520 including a flexible dielectric substrate 530 overlying a semiconductor chip 522 having an area array of contacts 526. The flexible dielectric substrate 530 is supported over a contact-bearing face of the semiconductor chip 522 by support elements 570. At least some of the support elements 570 are conductive support elements, such as conductive support element 570A that electrically interconnects contact 526A with conductive trace 536A. Thus, some support elements 570 may be used only for supporting flexible dielectric substrate 530 over the contact-bearing face of semiconductor chip 522 while other support elements may be both supportive and conductive for electrically interconnecting one or more conductive posts 542 with the semiconductor chip 522. Such a structure is disclosed in greater detail in the co-pending, commonly assigned U.S. Provisional Application No. 60/533,210 filed Dec. 30, 2003, "MICROELECTRONIC PACKAGES AND METHODS THEREFOR," the disclosure of which is hereby incorporated herein by reference. As discussed in greater detail in that co-pending application, the support elements allow the substrate to flex at least in regions of the substrate disposed between the support elements. Thus, where the bases of the posts are offset in horizontal directions from the support element, flexure of the support element allows movement of individual posts. In the embodiment of FIG. 7, this action is combined with the isolating action of gaps 550 at least partially surrounding and defining individual regions of the substrate, to further promote independent movement of the posts.

Figure 8A:
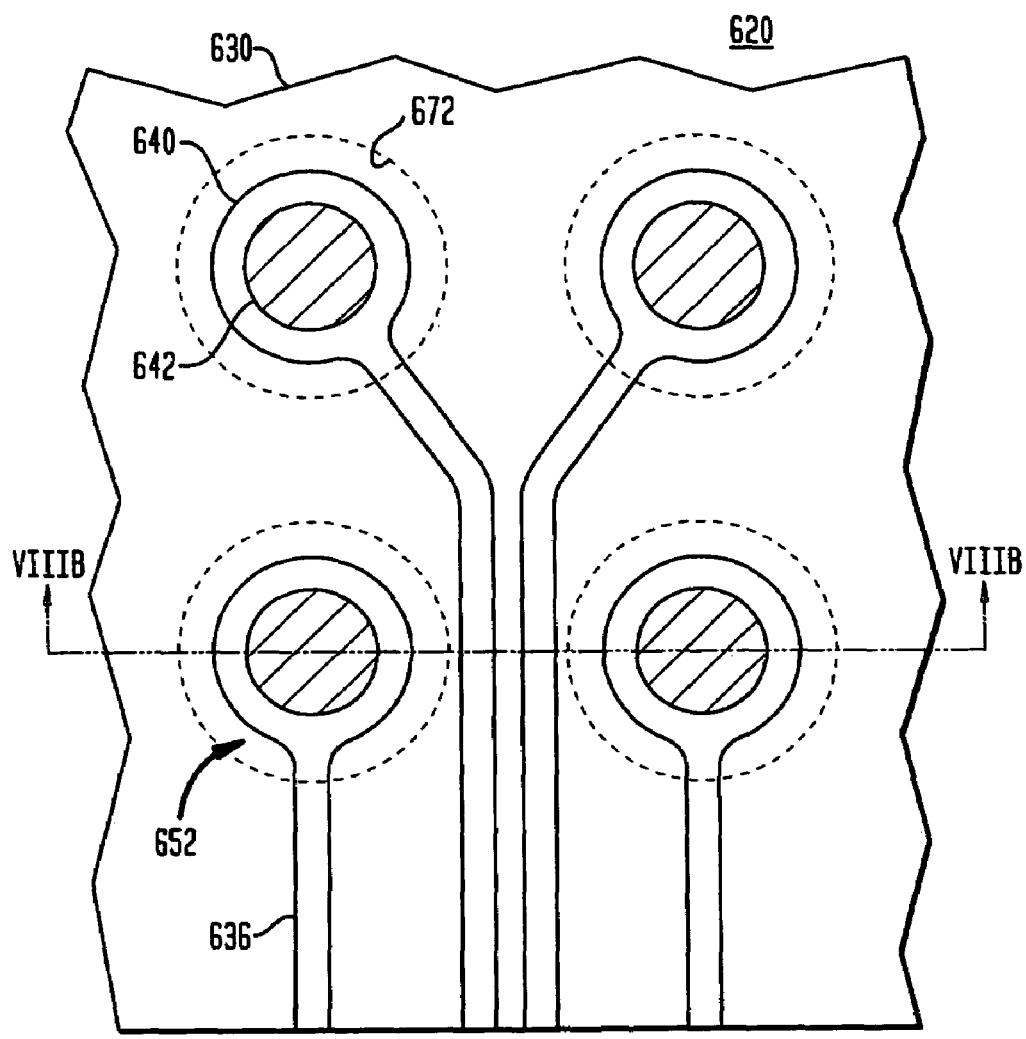
FIG. 8A shows a fragmentary plan view of a microelectronic package, in accordance with yet other preferred embodiments of the present invention.
Figure 8B:
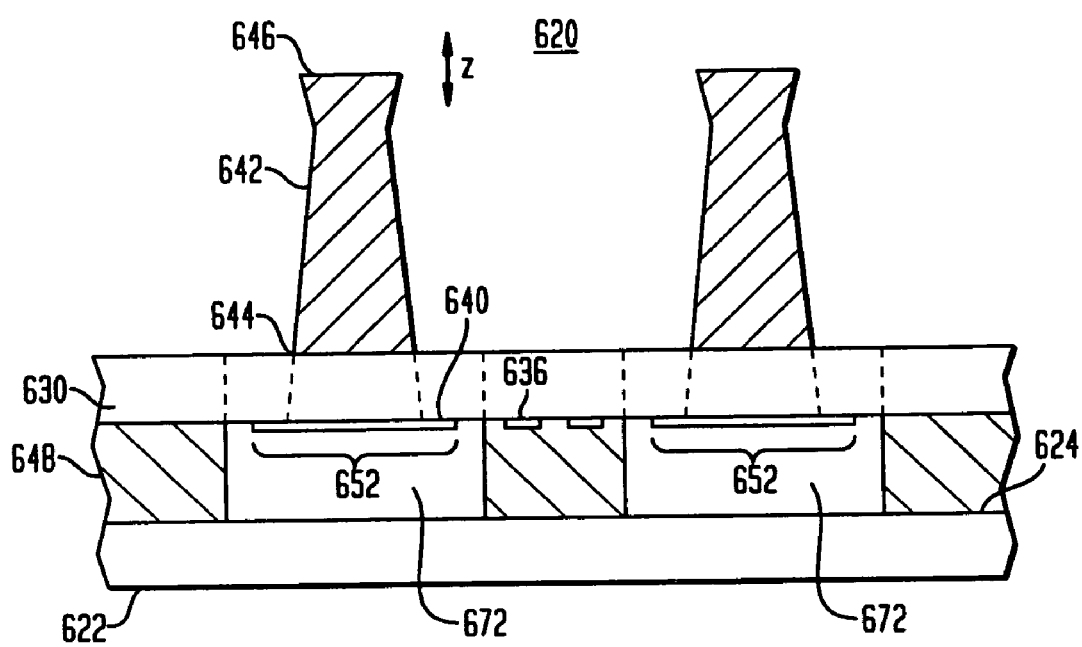
FIG. 8B shows a cross-sectional view of the microelectronic package shown in FIG. 8A.

Referring to FIGS. 8A and 8B a microelectronic package 620 in accordance with another embodiment of the present invention includes a microelectronic element such as a semiconductor chip 622, a support layer 648 overlying a front face 624 of the semiconductor chip and a flexible dielectric substrate 630 overlying the support layer 648. The support layer may be compliant or rigid. The package further includes conductive posts 642 mounted to the flexible dielectric substrate as described above with respect to FIGS. 1A and 1B. Here again, the conductive posts 642 have bases 644 physically connected to the substrate 630 and have tip ends 646 remote from the substrate. Each conductive post is attached to a capture pad 640, which is electrically interconnected with a conductive trace 636. In this embodiment, substrate 630 does not include gaps as discussed above.

Support layer 648 includes openings 672. Openings 672 of the support layer are aligned with the respective bases 644 of the conductive posts 642. Openings 672 in the compliant layer 648 may be formed by etching, punching, laser or high-pressure liquid stream cutting of a continuous layer, or by forming the layer with the openings using a process such as molding or silk-screening of a curable material. Although the openings 672 are depicted as extending entirely through the support layer 648, this is not essential; the openings should be open to the surface of the support layer confronting the posts and flexible substrate, but need not be open to the opposite surface of the support layer, confronting the microelectronic element 622. The alignment of the bases 644 of the conductive posts 642 with the openings 672 facilitates movement of the conductive posts independently of one another. Thus, each post 642 is disposed on a region 652 of the substrate aligned with an opening 672. Although these regions are not physically separated from the remainder of the substrate, each such region 652 can deform by bowing or bending downwardly into the associated opening 672. This type of deformation does not require deformation of other portions of the substrate 630. Where the support layer 648 has appreciable compliance, loads applied to an individual post 642 may also cause some compression of those portions of the support layer surrounding openings 672. Depending upon the compliance of the support layer and the properties of the substrate, some of the deformation caused by loads applied to one post may extend to or beyond the neighboring post. Nonetheless, the posts can still move independently of one another to a greater degree than would be the case without openings 672. The openings materially increase the effective compliance of the system, as, for example, the motion imparted to a single post 642 by application of a given load to such post.

Figure 9A:
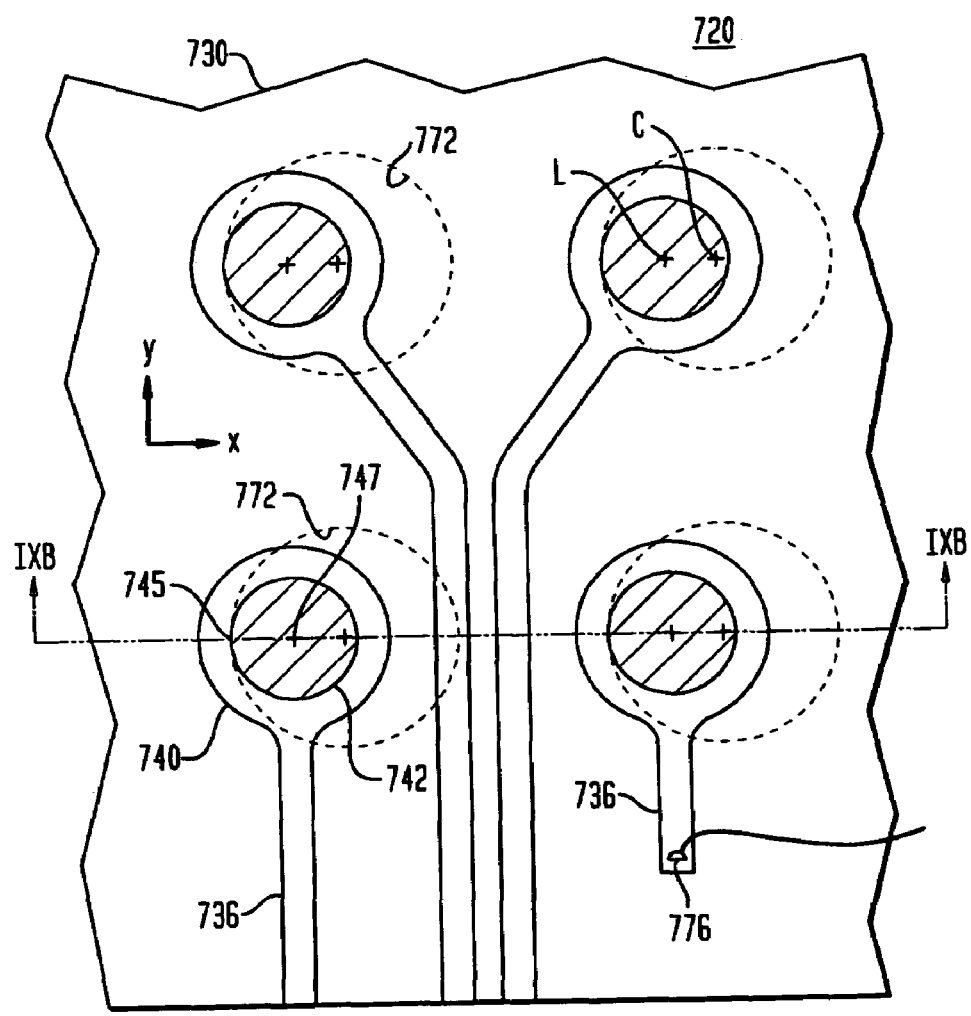
FIG. 9A shows a fragmentary plan view of a microelectronic package, in accordance with still other preferred embodiments of the present invention.
Figure 9B:
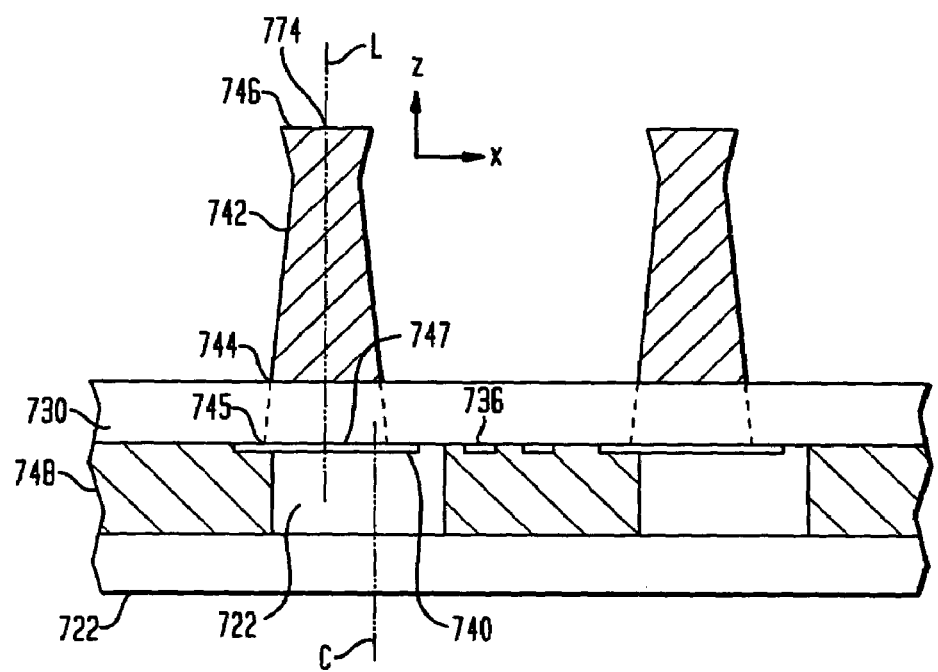
FIG. 9B shows a cross-sectional view of the microelectronic package shown in FIG. 9A.

FIGS. 9A and 9B show a microelectronic package 720 in accordance with another preferred embodiment of the present invention. The package includes a microelectronic element such as a semiconductor chip 722, a support layer 748 overlying the chip 722 and a flexible dielectric substrate 730 overlying the support layer 748. The package includes conductive posts 742 having bases 744 and tip ends 746. Each tip end includes a center 774 defining a longitudinal axis L extending the length of the conductive post 742. The base 744 of post 742 is connected by with a trace 736. This package is generally similar to the package described above with reference to FIGS. 8A and 8B. However, in the package of FIGS. 9A and 9B, the base 744 of each post does is not fully aligned with the opening 772 extending through compliant layer 748. State another way, the longitudinal axis L of the post is offset in a horizontal direction X from the center C of the associated opening 772. A first or edge region 745 of the conductive post base overlies the top surface of support layer 748 and a second or central region 747 of the post base overlies the opening 772. However, the longitudinal axis L through the tip center 774 is aligned with the opening 772, and thus passes through central region 747. During engagement with contact pads as, for example, in a testing operation as discussed with reference to FIG. 2B, vertical or Z-direction loads resulting from engagement of the post tips 746 with the contact pads are applied generally along the axis L passing through the tip center and passing through the second or central region 747 of the post base. This tends to push the second or central region 747 of the post base, and the adjacent portion of substrate 730, downwardly into opening 772. However, the first or edge region 745 of the post base is restrained to at least some degree against such downward movement by support layer 748. As a result, the substrate in the vicinity of each post 742 tends to bend about a horizontal axis in the vicinity of the post, so that the post tilts relative to the front face of the semiconductor chip 722. In much the same way as explained above with reference to FIG. 2B, such deformation of the substrate allows the tip of each conductive post to move, substantially independently of the other posts, Z-axis direction as well toward microelectronic element 722, and also provides wiping action in the horizontal or X direction.

In certain embodiments, the support layer 748 between the flexible dielectric sheet 730 and the semiconductor chip 722 may be substantially rigid. Such a support layer provides particularly good conditions for bonding leads such as a wire bond 776 to one or more of the traces 736 on the flexible substrate. The relatively stiff support layer provides good support for forcible engagement of the wire bond with the trace.

Figure 10A:
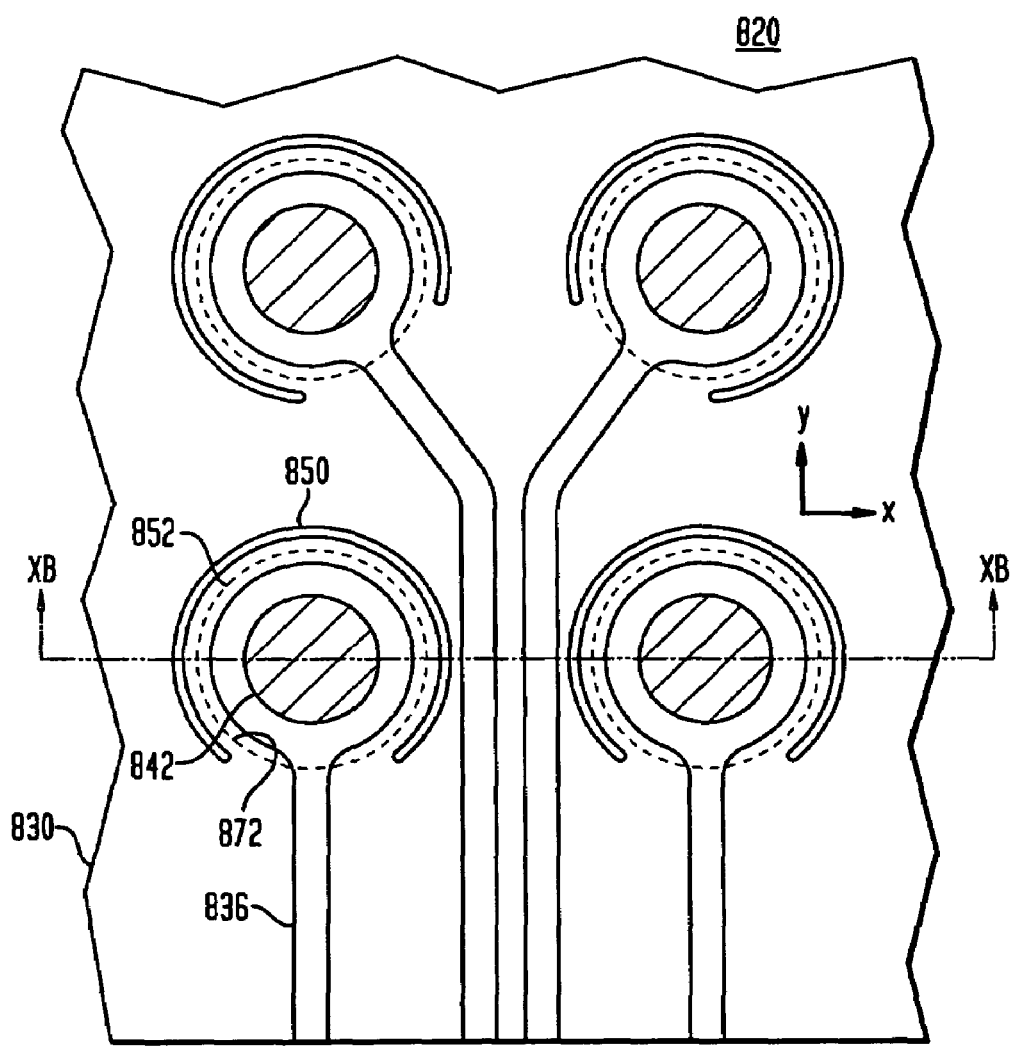
FIG. 10A shows a fragmentary plan view of a microelectronic package, in accordance with yet further preferred embodiments of the present invention.
Figure 10B:
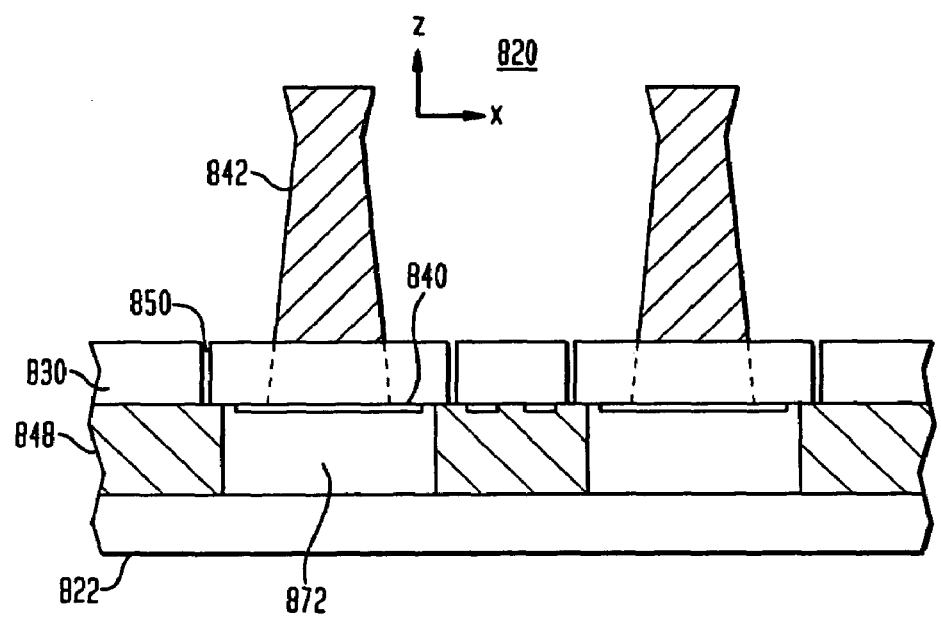
FIG. 10B shows a cross-sectional view of the microelectronic package shown in FIG. 10A.

FIGS. 10A and 10B show a microelectronic package 820 that incorporates certain features of the packages described in FIGS. 1A-1B and 8A-8B. The microelectronic package includes a microelectronic element such as a semiconductor chip 822, a support layer 848 overlying the front face of the semiconductor chip 822 and a flexible dielectric substrate 830 overlying the support layer 848. The flexible substrate 830 has gaps 850 formed therein to provide hinge-like movement for regions 852 of the substrate conductive posts 842 attached thereto. The conductive posts 842 are aligned with openings 872 extending through support layer 848. The package provides Z compliancy as well as axes wiping action for the conductive posts 842.

Figure 11A:
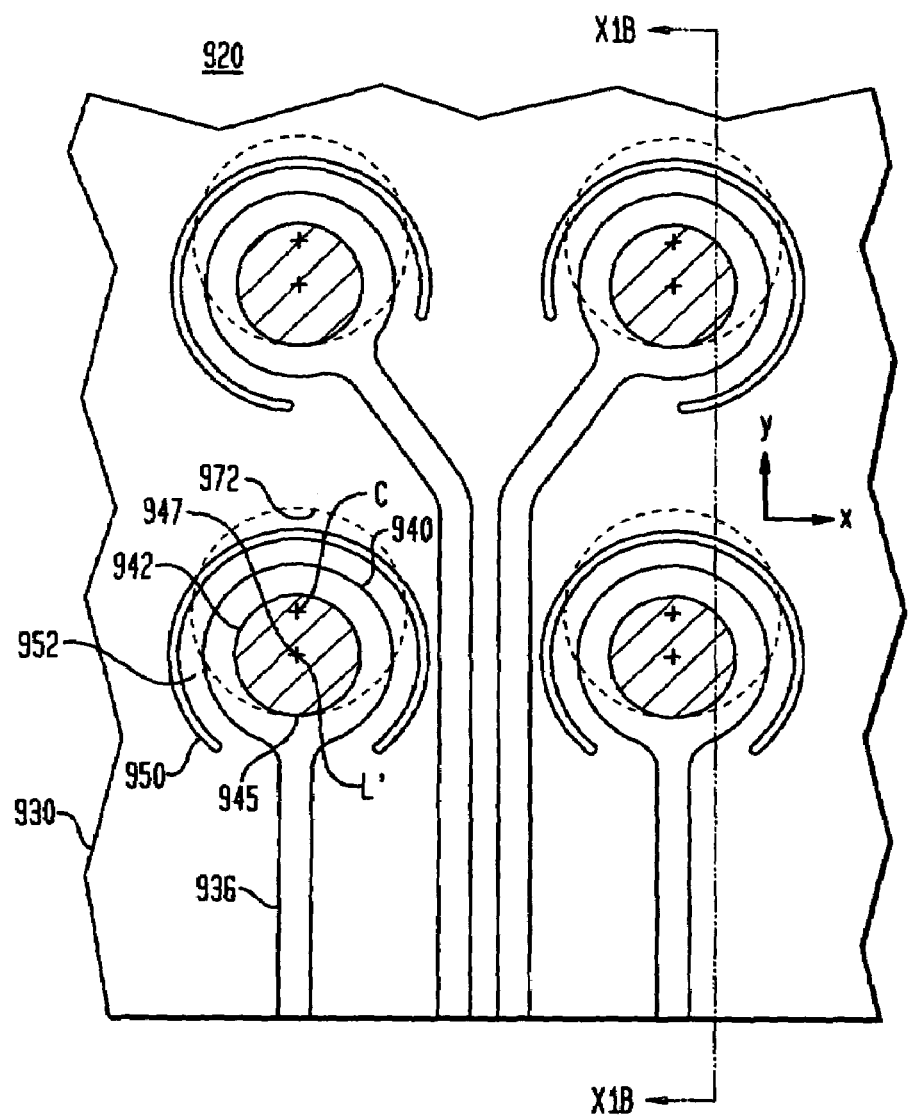
FIG. 11A shows a fragmentary plan view of a microelectronic package, in accordance with another preferred embodiment of the present invention.
Figure 11B:
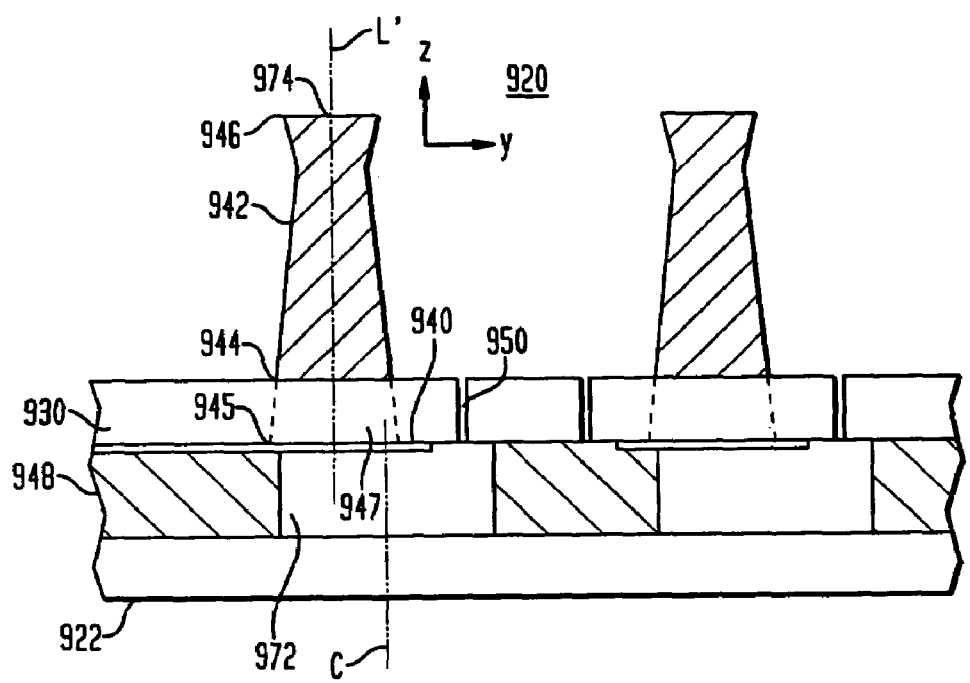
FIG. 11B shows a cross-sectional view of the microelectronic package shown in FIG. 11A.

A microelectronic package 920 according to yet another embodiment of the present invention (FIGS. 11A and 11B) combines certain features described above in the packages shown in FIGS. 1A-1B and 9A-9B. The microelectronic package 920 includes a microelectronic element such as a semiconductor chip 922, a support layer 948 overlying the semiconductor chip 922 and a flexible dielectric substrate 930 overlying the support layer 948. Here again, the package includes conductive traces 936 connected with the bases 944 of conductive posts 942. Each conductive post 942 includes a tip 946 having a center 974 defining a longitudinal axis L' of the conductive post. The flexible substrate 930 includes gaps 950 formed therein to provide regions 952 of the flexible dielectric substrate 930 that are hingedly connected to the remainder of the dielectric substrate. The centers C of openings 972 in the support layer do not completely coincide with the bases 944 of conductive posts 942. As a result, a first section 945 of each conductive post 942 overlies the support layer 948 and a second section 947 overlies the opening 972. This arrangement provides for a hinge-like movement at the base of conductive posts 942. In operation, the hinge-like action of the flexible substrate combines with the partial alignment of the conductive post with the opening 972 to provide a tilting action to the post the tip 946 engages a contact pad. Thus, the microelectronic package 920 of FIGS. 11A and FIG. 11B can accommodate for non-planarity as well as provide for wiping motion of the tips 946 of conductive posts 942.

Figure 12B:
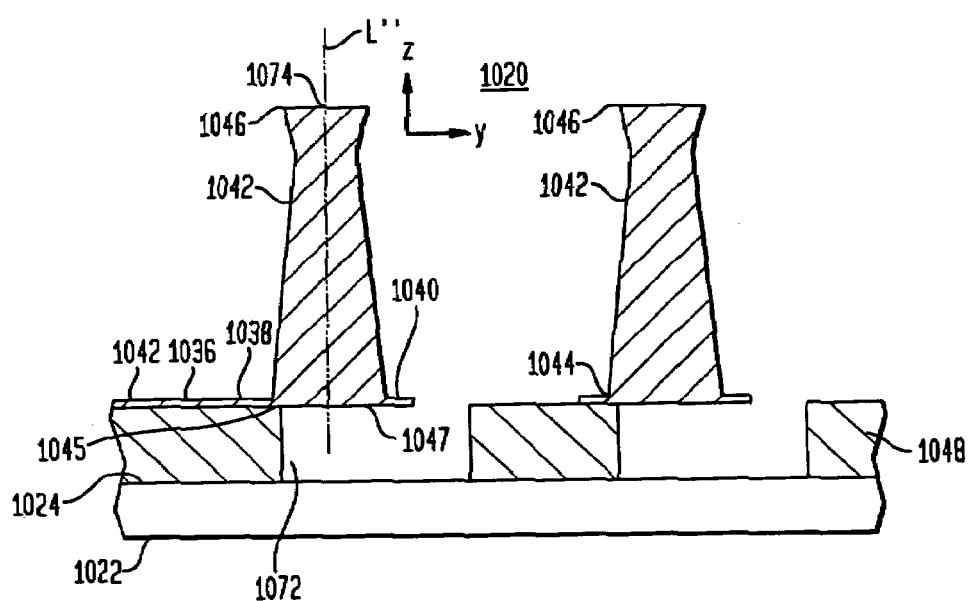
FIG. 12B shows a cross-sectional view of the microelectronic package shown in FIG. 12A.

FIGS. 12A and 12B depict a microelectronic package 1020 including a microelectronic element such as a semiconductor chip 1022 having a contact-bearing face 1024 and a support layer 1048 overlying the contact-bearing face. The layer 1048 may be a compliant layer or may be substantially non-compliant. The microelectronic package includes conductive traces 1036 having post ends 1038 terminating at capture pads 1040 and posts 1042 and contact ends 1042 remote from the post ends. The package includes conductive posts 1042, each post having a base 1044 and a tip 1046 remote therefrom. In this embodiment, the traces 1036 and capture pads 1040, in conjunction with support layer 1048, serve as the physical mounting elements which hold the posts 1042.

In this embodiment as well, the tip of each post has a center point 1074 and a longitudinal axis L" extends through the center, lengthwise along the post. Support layer 1048 has openings 1072 extending therethrough. The openings 1072 do not completely coincide with the capture pad 1040 and the base 1044 of conductive post 1042. Thus, in this embodiment as well, a first section 1045 of conductive post 1042 overlies layer 1048 and a second section 1047 of conductive post 1042 overlies opening 1072. Here again, the center point 1074 of tip 1046 and longitudinal axis L" are aligned with opening 1072 of layer 1048. The post end 1038 of each trace forms a resilient hinge-like connection at the base 1044 of conductive posts 1042. The hinge-like connection enables the conductive posts to tilt action when the tip ends are abutted against opposing contacts. In this embodiment a flexible dielectric substrate is not required; the conductive posts and traces may be disposed directly atop layer 1048.

Figure 13:
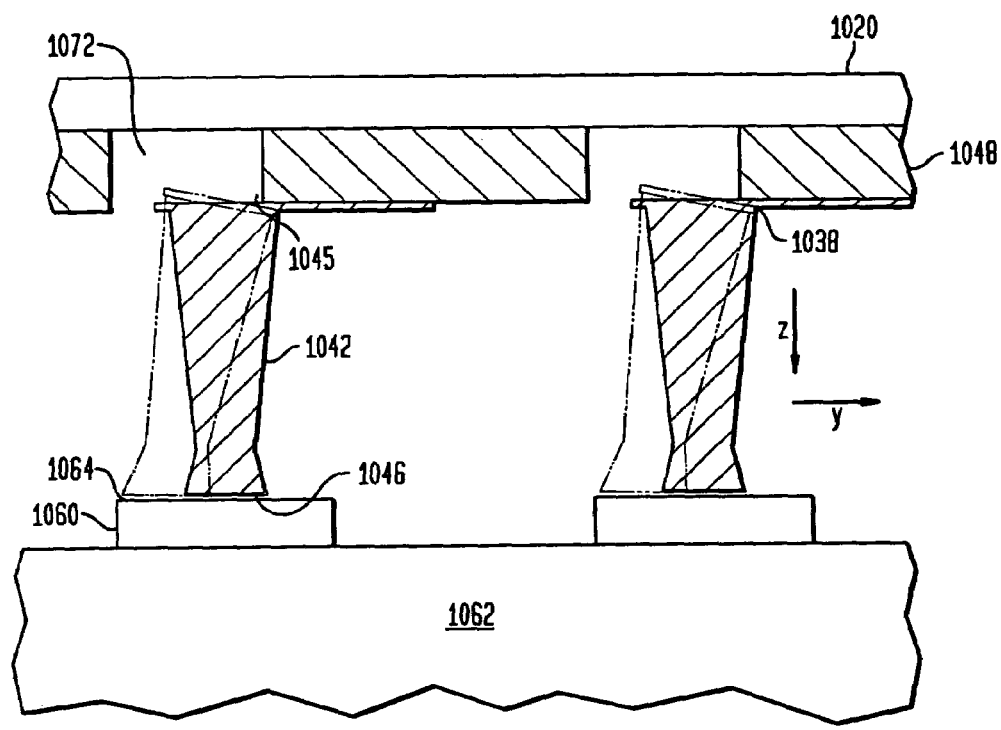
FIG. 13 shows a cross-sectional view of the microelectronic package shown in FIG. 12A during a testing operation.

FIG. 13 shows the microelectronic package 1020 of FIGS. 12A and 12B during a testing operation. The microelectronic package 1020 is placed so that the tip ends 1046 of conductive posts 1042 are juxtaposed with top surfaces 1064 of contacts 1060 of a test substrate 1062. The microelectronic package 1020 is moved toward the test substrate in a direction indicated by axis Z until the tip ends 1046 engage the top surfaces 1064 of the contact 1060. Here again, engagement of the post tips with the contact surfaces 1064 causes the posts to tilt as shown in broken lines in FIG. 13, thus moving the tip of each post independently in the vertical or Z direction, and also providing some wiping motion in the Y direction. The microelectronic package as a whole may be moved relative to test substrate 1062 in the horizontal direction indicated by axis Y to provide additional wiping action.

Figure 14:
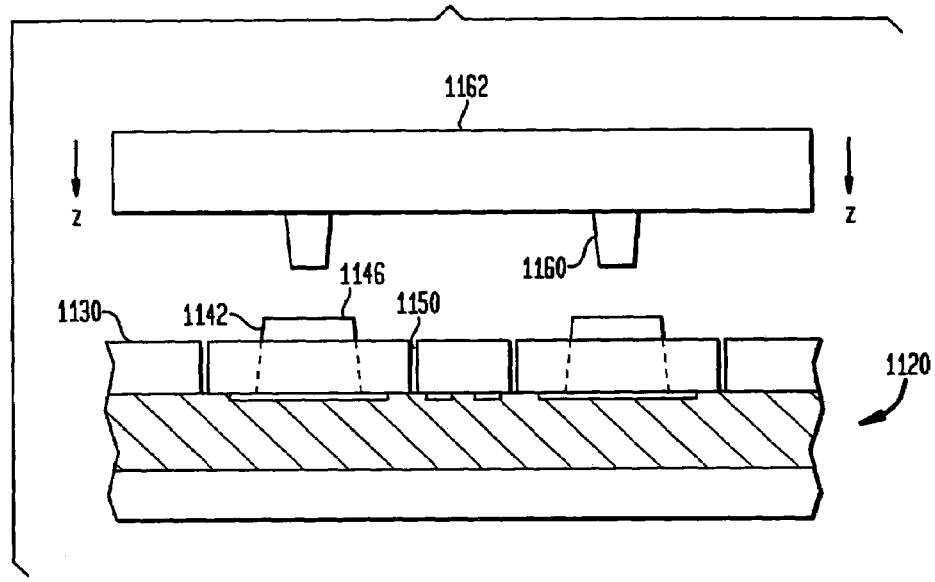
FIG. 14 shows a cross-sectional view of the microelectronic package, in accordance with still further preferred embodiments of the present invention.

FIG. 14 shows a microelectronic package 1120 in accordance another embodiment of the present invention. The microelectronic package 1120 is substantially similar to that shown and described above in FIGS. 1A and 1B. However, the microelectronic package 1120 has conductive terminals 1142 in the form of generally planar pads rather than the elongated conductive posts described above. During testing, a second microelectronic element or test substrate 1162 having conductive probes 1160 may be juxtaposed with the conductive terminals 1142. During testing, the probes may be abutted against the top surface 1146 of the conductive terminals 1142. The gaps 1150 provided in flexible dielectric substrate 1130 enable each of the conductive terminals 1142 to move independently of one another in a Z direction for forming a more reliable electrical interconnection between the microelectronic package 1120 and the test board 1162. Similar flat pad terminals, and other types of terminals may be used in the other arrangements discussed above.

In the embodiments discussed above with respect to FIGS. 1A-3,7 and 9A-13, the support structure which holds the terminals tends to deform in a non-uniform manner so that the terminals tilt. However, it is not essential to provide discrete features such as the gaps and flap structures of FIGS. 1A-3 or the partially-aligned support layer of FIGS. 9A-13 in order to induce tilt in response to a vertically-directed contact force applied to the terminal. Merely by way of example, the support structure can include one or more layers of non-uniform compressibility or non-uniform stiffness, so that the vertical compliance of the support structure varies in horizontal directions. Provided that such non-uniformity causes the upwardly-directed reaction force applied by the support structure to the terminal to act a location horizontally offset from the line of action of the downwardly-directed contact force applied by the contact, the terminal will tend to tilt and provide the wiping action discussed above.

In certain preferred embodiments of the present invention, a particle coating such as that disclosed in U.S. Pat. Nos. 4,804,132 and 5,083,697, the disclosures of which are incorporated by reference herein, may be provided on one or more electrically conductive parts of a microelectronic package for enhancing the formation of electrical interconnections between microelectronic elements and for facilitating testing of microelectronic packages. The particle coating is preferably provided over conductive parts such as conductive terminals or the tip ends of conductive posts. In one particularly preferred embodiment, the particle coating is a metalized diamond crystal coating that is selectively electroplated onto the conductive parts of a microelectronic element using standard photoresist techniques. In operation, a conductive part with the diamond crystal coating may be pressed onto an opposing contact pad for piercing the oxidation layer present at the outer surface of the contact pad. The diamond crystal coating facilitates the formation of reliable electrical interconnections through penetration of oxide layers, in addition to traditional wiping action.

As disclosed in greater detail in the co-pending, co-pending, commonly assigned U.S. Provisional Application No. 60/533,393 filed Dec. 30, 2003, entitled "MICRO PIN GRID ARRAY WITH WIPING ACTION," the disclosure of which is hereby incorporated herein by reference, the posts may be provided with features which further promote wiping action and otherwise facilitate engagement of the posts and contacts. For example, in a package incorporating post-like terminals, the tip end or upper extremity of each post may be horizontally offset from the center of the base of that post. Such offset can be used in addition to, or in lieu of, the features discussed above for promoting tilting of the posts. Also, the posts can be provided with features such as sharp edges or asperities for promoting more reliable engagement with contact pads.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
   a microelectronic element having faces and contacts;
   a flexible substrate overlying and spaced from a first face of said microelectronic element;
   a plurality of conductive package terminals exposed at a surface of said flexible substrate remote from the first face of said microelectronic element for external conductive interconnection of said microelectronic package, said conductive package terminals being electrically interconnected with said contacts of said microelectronic element, wherein said flexible substrate includes a gap extending at least partially around at least one of said conductive package terminals; and
   a dielectric layer disposed between said microelectronic element and said plurality of conductive package terminals.

2. The microelectronic package as claimed in claim 1, wherein said flexible substrate includes a plurality of gaps defining a plurality of regions of said substrate, each said conductive package terminal being connected with one of said plurality of regions and extending from said one of said plurality of regions, each of said plurality of regions being movable independently of one another so as to permit said conductive package terminals connected with each of said plurality of regions to also be movable independently of one another.

3. The microelectronic package of claim 2, wherein some of said conductive package terminals extend from some of said plurality of regions of said substrate.

4. The microelectronic package of claim 3, wherein said plurality of regions include first and second regions, said conductive package terminals extending from said first region, said first and second regions moving relative to one another.

5. The microelectronic package as claimed in claim 1, wherein said conductive package terminals face away from the first face of said microelectronic element.

6. The microelectronic package as claimed in claim 1, wherein said conductive package terminals include conductive posts extending from said flexible substrate and projecting away from the first face of said microelectronic element.

7. The microelectronic package as claimed in claim 1, wherein said dielectric layer includes a support layer disposed between the first face of said microelectronic element and said flexible substrate.

8. The microelectronic package as claimed in claim 7, wherein said support layer is compliant.

9. The microelectronic package as claimed in claim 1, wherein the gap in said flexible substrate extends more than halfway around the at least one of said conductive package terminals to define a flap portion of said flexible substrate that is hingedly connected with a remaining portion of said flexible substrate.

10. The microelectronic package as claimed in claim 9, wherein the at least one of said conductive package terminals is connected to the flap portion of said flexible substrate.

11. The microelectronic package as claimed in claim 1, wherein said gap defines first and second regions of said flexible substrate, said first region being movable relative to said second region, and wherein the at least one of said conductive package terminals lies in said first region of said flexible substrate.

12. The microelectronic package as claimed in claim 1, wherein said gap extends at least partially around two or more of said conductive package terminals.

13. The microelectronic package as claimed in claim 1, wherein said gap lies between two or more of said conductive package terminals.

14. The microelectronic package as claimed in claim 1, wherein said gap has an asymmetrical shape.

15. The microelectronic package as claimed in claim 1, wherein said gap has a circular segment.

16. The microelectronic package as claimed in claim 1, wherein said gap is continuous.

17. The microelectronic package as claimed in claim 1, wherein said gap is intermittent.

18. The microelectronic package as claimed in claim 1, wherein said contacts are accessible at the first face of said microelectronic element.

19. The microelectronic package as claimed in claim 1, wherein said microelectronic element has a second face opposite the first face and wherein said contacts are accessible at the second face of said microelectronic element.

20. The microelectronic package as claimed in claim 1, further comprising conductive elements electrically interconnecting said conductive package terminals and said microelectronic element.

21. The microelectronic package as claimed in claim 1, wherein said flexible substrate includes a dielectric sheet.

22. The microelectronic package as claimed in claim 1, wherein said flexible substrate includes a polymeric film.

23. The microelectronic package as claimed in claim 1, wherein said flexible substrate has conductive traces for electrically interconnecting said conductive package terminals and said microelectronic element.

24. The microelectronic package as claimed in claim 1 wherein said dielectric layer comprises a compliant layer.

* * * * *